US008116893B2

(12) United States Patent
Tsushima

(10) Patent No.: US 8,116,893 B2
(45) Date of Patent: Feb. 14, 2012

(54) DICING METHOD

(75) Inventor: Takeo Tsushima, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 12/743,511

(22) PCT Filed: Nov. 13, 2008

(86) PCT No.: PCT/JP2008/070662

§ 371 (c)(1),
(2), (4) Date: May 18, 2010

(87) PCT Pub. No.: WO2009/066602

PCT Pub. Date: May 28, 2009

(65) Prior Publication Data

US 2011/0054657 A1 Mar. 3, 2011

(30) Foreign Application Priority Data

Nov. 19, 2007 (JP) ................................ 2007-299246

(51) Int. Cl.
*G06F 19/00* (2011.01)
*H01L 21/00* (2006.01)

(52) U.S. Cl. ........... 700/101; 438/16; 438/113; 382/145

(58) Field of Classification Search .................... 700/99, 700/100, 101, 121; 438/113, 14, 16; 83/310; 382/145

See application file for complete search history.

(56) References Cited

U.S. PATENT DOCUMENTS 6,052,627 A * 4/2000 Nakamura .................... 700/182
7,338,345 B2 * 3/2008 Fujinami ............................ 451/5
7,727,810 B2 * 6/2010 Arai et al. ...................... 438/113
2004/0265100 A1 * 12/2004 Ohkawara et al. ....... 414/416.03
2006/0057820 A1 * 3/2006 Yamanaka .................... 438/458

(Continued)

FOREIGN PATENT DOCUMENTS

JP 2002-280328 A 9/2002

(Continued)

OTHER PUBLICATIONS

International Search Report—PCT/JP2008/070662 dated Feb. 17, 2009.

Written Opinion of the International Searching Authority—PCT/ISA/237 dated Feb. 17, 2009 for PCT/JP2008/070662.

*Primary Examiner* — Charles Kasenge

(74) *Attorney, Agent, or Firm* — Birch, Stewart, Kolasch & Birch, LLP

(57) ABSTRACT

According to an aspect of the present invention, there is provided a dicing apparatus in which: in a case where a control device detects, during an image pickup of a workpiece set onto a second worktable by a first image pickup device and a second image pickup device, that an image of a workpiece set onto a first worktable also needs to be picked up by the first image pickup device and the second image pickup device, the control device determines a priority between an operation performed on the first worktable and an operation performed on the second worktable; and when it is determined that the operation performed on the first worktable has a higher priority, the image pickup of the workpiece set onto the second worktable is interrupted, and the first image pickup device and the second image pickup device are moved to perform an image pickup of the workpiece on the first worktable.

3 Claims, 9 Drawing Sheets

U.S. PATENT DOCUMENTS

| | | | | |
|---|---|---|---|---|
| 2006/0112802 | A1* | 6/2006 | Fujinami | 83/310 |
| 2008/0147222 | A1* | 6/2008 | McIntyre et al. | 700/108 |

FOREIGN PATENT DOCUMENTS

| | | | |
|---|---|---|---|
| JP | 2004-288792 | A | 10/2004 |
| JP | 2005-85972 | A | 3/2005 |
| JP | 2006-156809 | A | 6/2006 |
| JP | 2007-105861 | A | 4/2007 |

* cited by examiner

DICING METHOD

TECHNICAL FIELD

The present invention relates to a dicing method for dividing, into chips, a workpiece such as a wafer on which semiconductor elements or electronic components are formed.

BACKGROUND ART

A dicing apparatus, which performs a cutting or groove-forming process on a workpiece such as a wafer on which semiconductor elements or electronic components are formed, includes at least: a rotary blade which is formed of a thin grindstone called a blade and is rotated by a spindle at high speed; a worktable which holds the workpiece; and X, Y, Z, and θ moving shafts which change a relative position between the worktable and the blade. At the time of processing the workpiece, a cutting fluid for cooling or lubrication is supplied from a nozzle to the rotating blade or a processing point at which the workpiece and the blade contact each other, and the cutting or groove-forming process is performed on the workpiece by the operations of the respective moving shafts.

FIG. 8 illustrates a conventional example of the dicing apparatus. A dicing apparatus 70 includes a processing part 75. The processing part has: high-frequency motor built-in type spindles 72, 72 respectively equipped with a blade 71 and a wheel cover (not shown) on their tips, and disposed so as to be opposed to each other; a worktable 73 which adsorbs and holds a workpiece W; and an image pickup device 74 formed of a microscope, a CCD camera, or the like for picking up an image of the workpiece W. In addition to these components, the dicing apparatus 70 includes: a cleaning part 76 which spin-cleans the processed workpiece W which has been processed by the processing part 75; a load port 77 onto which a cassette that houses a large number of the workpieces W mounted on a frame F is set; a conveyance device 78 which conveys the workpiece W; a controller 79 which controls the operations of the respective parts; and the like.

As illustrated in FIG. 9, the structure of the processing part 75 includes an X table 83 which is guided by X guides 81, 81 provided to an X base 80 and is driven by a linear motor 82 in an X direction indicated by X-X of the figure. A worktable 85 is provided to the X table 83 via a rotary table 84 which rotates in a θ direction.

On the other hand, Y tables 88, 88 which are guided by Y guides 87, 87 and are driven by a stepper motor (not shown) and a ball screw (not shown) in a Y direction indicated by Y-Y of the figure are provided on a side surface of a Y base 86. A Z table 89 which is driven by a drive device (not shown) in a Z direction indicated by Z-Z of the figure is provided to each of the Y tables 88. The high-frequency motor built-in type spindle 72 which has the blade 71 on its tip is fixed to the Z table 89. The processing part 75 has the structure as described above, and hence the blade 71 is step-fed (fed in a stepwise manner) in the Y direction and also is fed while cutting-in (cutting-in feed) in the Z direction, and the worktable 73 is fed while cutting (cutting feed) in the X direction.

The spindles 72 are both rotated at a high speed of 1,000 rpm to 80,000 rpm, and a supply nozzle (not shown) which supplies the cutting fluid into which the workpiece W is to be immersed is provided in the vicinity of the spindles 72.

An electrodeposition blade obtained by electrodepositing diamond abrasive grains or CBN abrasive grains with nickel, a metal-resin bonding blade obtained by bonding with a resin mixed with a metal power, or the like is used as the blade 71. The dimensions of the blade 71 are variously selected depending on the processing type. In a case where a general semiconductor wafer is diced into the workpiece, a blade having a diameter of approximately 50 mm and a thickness of approximately 30 μm is used.

In addition, the controller which controls the operations of the respective parts of the dicing apparatus 70 includes a CPU, a memory, an input/output circuit part, various control circuit parts, and the like, and is incorporated inside a pedestal of the dicing apparatus 70. As the dicing apparatus having the above-mentioned structure, for example, a dicing apparatus disclosed in Patent Document 1 has been proposed.

In the dicing apparatus 70 having the above-mentioned structure, as a stage prior to the processing, an alignment operation is performed, in which an image of the workpiece W is picked up by the image pickup device 74 and the position of the workpiece W is aligned with the blade 71. Also during the processing, if necessary, an image of the workpiece W is picked up by the image pickup device 74 as appropriate to check a processing condition. However, in the dicing apparatus 70, only one worktable 73 onto which the workpiece W is set and only one image pickup device 74 which picks up an image of the workpiece are provided. Therefore, during the processing of one workpiece W, it is not possible to set another new workpiece W onto the worktable 73 to perform the alignment by the image pickup device 74. Accordingly, the utilization rate of the image pickup device is low, and in addition, the utilization rate of the entire dicing apparatus is also deteriorated.

As a solution to such a problem, Patent Document 2 discloses a dicing apparatus in which two blades, two worktables, and two image pickup devices are provided. In this dicing apparatus, a workpiece which is set onto one worktable is aligned by one image pickup device, while a workpiece which is set onto another worktable is aligned by another image pickup device. Then, the workpiece which is set onto the one worktable is processed by one blade, while the workpiece which is set onto the another worktable is processed by another blade. Alternatively, the workpiece which is set onto the one worktable or the another worktable is processed by both the one blade and the another blade. In this manner, two workpieces are aligned individually by the two image pickup devices, and one workpiece is processed by the two blades, whereby the utilization rate of the dicing apparatus is improved.

Patent Document 1: Japanese Patent Application Laid-Open No. 2002-280328

Patent Document 2: Japanese Patent Application Laid-Open No. 2006-156809

DISCLOSURE OF THE INVENTION

Problem to be Solved by the Invention

However, in the dicing apparatus as disclosed in Patent Document 2, images of two workpieces are picked up individually by the two image pickup devices. Therefore, for example, even in a case where, during the image pickup of one workpiece on the one worktable, the image pickup device needs to be used for another workpiece on the another worktable, an image of the another workpiece cannot be picked up by the two image pickup devices until the end of the image pickup of the one workpiece. As a result, the utilization efficiency of the dicing apparatus is deteriorated.

The present invention has been made in order to solve the above-mentioned problem, and therefore aims to provide a dicing method which achieves an increase in utilization rate of image pickup device and also an improvement in utilization rate of an entire apparatus.

Means for Solving the Problem

In order to achieve the above-mentioned object, according to an aspect of the present invention, there is provided a dicing method which is used for a dicing apparatus including a first worktable and a second worktable each of which can have a workpiece set thereon, a first image pickup device and a second image pickup device which pick up an image of the workpiece, and a first cutting device and a second cutting device which perform cutting of the workpiece, and the first cutting device and the second cutting device are moved for cutting by a moving device relative to the first worktable or the second worktable, the dicing method comprising: in a case where a control device detects, during an image pickup of the workpiece set onto the second worktable by the first image pickup device and the second image pickup device, that an image of the workpiece set onto the first worktable also needs to be picked up by the first image pickup device and the second image pickup device, determining, by the control device, a priority between an operation performed on the first worktable and an operation performed on the second worktable; and when it is determined that the operation performed on the first worktable has a higher priority, interrupting the image pickup of the workpiece set onto the second worktable, and moving the first image pickup device and the second image pickup device to pickup an image of the workpiece on the first worktable.

According to this aspect, first, a workpiece is set onto the first worktable, an image of the workpiece is picked up by the first image pickup device and the second image pickup device to perform the alignment, and the first cutting device and the second cutting device are moved for cutting relative to the first worktable by a moving device. When the processing of the workpiece set onto the first worktable is started, another workpiece is set also to the second worktable, and the alignment is started by the first image pickup device and the second image pickup device.

In a case where the control device included in the dicing apparatus detects, during the alignment operation of the workpiece on the second worktable, that an image of the workpiece on the first worktable during the processing needs to be picked up again by the image pickup device, in order to perform a realignment, a kerf checking, or a checking of diced chips, the control apparatus determines the priority between the operation which is currently performed on the workpiece on the second worktable and the operation which is performed on the workpiece on the first worktable.

Normally, it takes a longer time to finish the dicing process of the workpiece excluding the alignment than the alignment operation. Further, if the workpiece during the processing is left for a long time, there arises a problem that the cutting fluid used for the processing is dried on the workpiece. Therefore, the processing operation has a higher priority than the alignment operation.

Accordingly, the control device temporarily stops the alignment operation of the workpiece on the second worktable, stores all pieces of data used for the alignment and state control information (position, automatic focus, and illuminated condition) on the position at the time of the interruption with regard to the workpiece whose image is currently being picked up by the image pickup device, and moves the image pickup device to a position at which an image of the workpiece on the first worktable is picked up. When the control device recognizes that the image pickup of the workpiece on the first worktable is finished and the image pickup device becomes available, the image pickup device is moved back to the position above the workpiece set onto the second worktable, which is stored in the control device, and restarts the unfinished alignment operation.

In this manner, the image pickup device is preferentially used for the operation having a higher priority, and the interrupted operation is restarted at the position at the time of the interruption. Accordingly, it becomes possible to increase the utilization rate of the image pickup device and to improve the utilization rate of the entire apparatus.

In order to achieve the above-mentioned object, according to another aspect of the present invention, there is provided a dicing method which is used for a dicing apparatus including a first worktable and a second worktable each of which can have a workpiece set thereon, a first image pickup device and a second image pickup device which pick up an image of the workpiece, and a first cutting device and a second cutting device which perform cutting of the workpiece, and the first cutting device and the second cutting device are moved for cutting by a moving device relative to the first worktable or the second worktable, the dicing method comprising: in a case where a control device detects, during an image pickup of the workpiece set onto the second worktable by the first image pickup device and the second image pickup device, that an image of the workpiece set onto the first worktable also needs to be picked up by any one of the first image pickup device and the second image pickup device, determining, by the control device, a priority between an operation performed on the first worktable and an operation performed on the second worktable; and when it is determined that the operation performed on the first worktable has a higher priority, moving any one of the first image pickup device and the second image pickup device which are performing the image pickup of the workpiece set onto the second worktable, to a position at which an image of the workpiece on the first worktable is picked up, to pickup the image.

According to this aspect, first, the alignment of a workpiece set onto the first worktable is performed, and the processing of the workpiece is started after the alignment. When the processing of the workpiece set onto the first worktable is started, another workpiece is also set to the second worktable, and the alignment is started.

In a case where the control device detects, during the alignment operation of the workpiece on the second worktable, that an image of the workpiece on the first worktable during the processing needs to be picked up again by the image pickup device, the control apparatus determines the priority between the operation which is currently performed on the workpiece on the second worktable and the operation which is performed on the workpiece on the first worktable.

When the control device determines that the operation which is performed on the first worktable has a higher priority than the operation which is performed on the second worktable, the control device moves any one of the first image pickup device and the second image pickup device which are performing the image pickup of the workpiece set onto the second worktable, to a position at which an image of the workpiece on the first worktable is picked up, to pickup the image.

In this manner, the first image pickup device or the second image pickup device is assigned to the operation having a higher priority to be used. Accordingly, it becomes possible to increase the utilization rate of the image pickup device and to improve the utilization rate of the entire apparatus.

Advantage of the Invention

As described above, according to the dicing method of the present invention, it becomes possible to increase the utilization rate of the image pickup device and also to improve the utilization rate of the entire apparatus.

DESCRIPTION OF SYMBOLS

1, 70 . . . dicing apparatus, 5A . . . first image pickup device, 5B . . . second image pickup device, 8 . . . controller (control device), 9 . . . rotary blade, 10 . . . spindle, 12 . . . first worktable, 14 . . . second worktable, 16, 18 . . . X table, 20 . . . oil pan, 22 . . . guide rail, 24 . . . ball screw, 26 . . . servomotor, 28 . . . ball nut, 30 . . . slider, 32 . . . θ table, 33 . . . fixture, 34 . . . accordion cover, 36 . . . guide rail, 38 . . . ball screw, 40 . . . servomotor, 44 . . . θ table, 46 . . . accordion cover, 48 . . . guide base, 50 . . . spindle Y guide, 52 . . . spindle Y table, 54 . . . spindle Z table, 56 . . . holder, 58, 60 . . . image pickup device drive device, 62 . . . image pickup device Y guide, 64A, 64B . . . image pickup device Y table, 66A, 66B . . . image pickup device Z table Best Mode for Carrying out the Invention Hereinafter, a preferred embodiment of a dicing method according to the present invention is described in detail with reference to the accompanying drawings.

Figure 1:
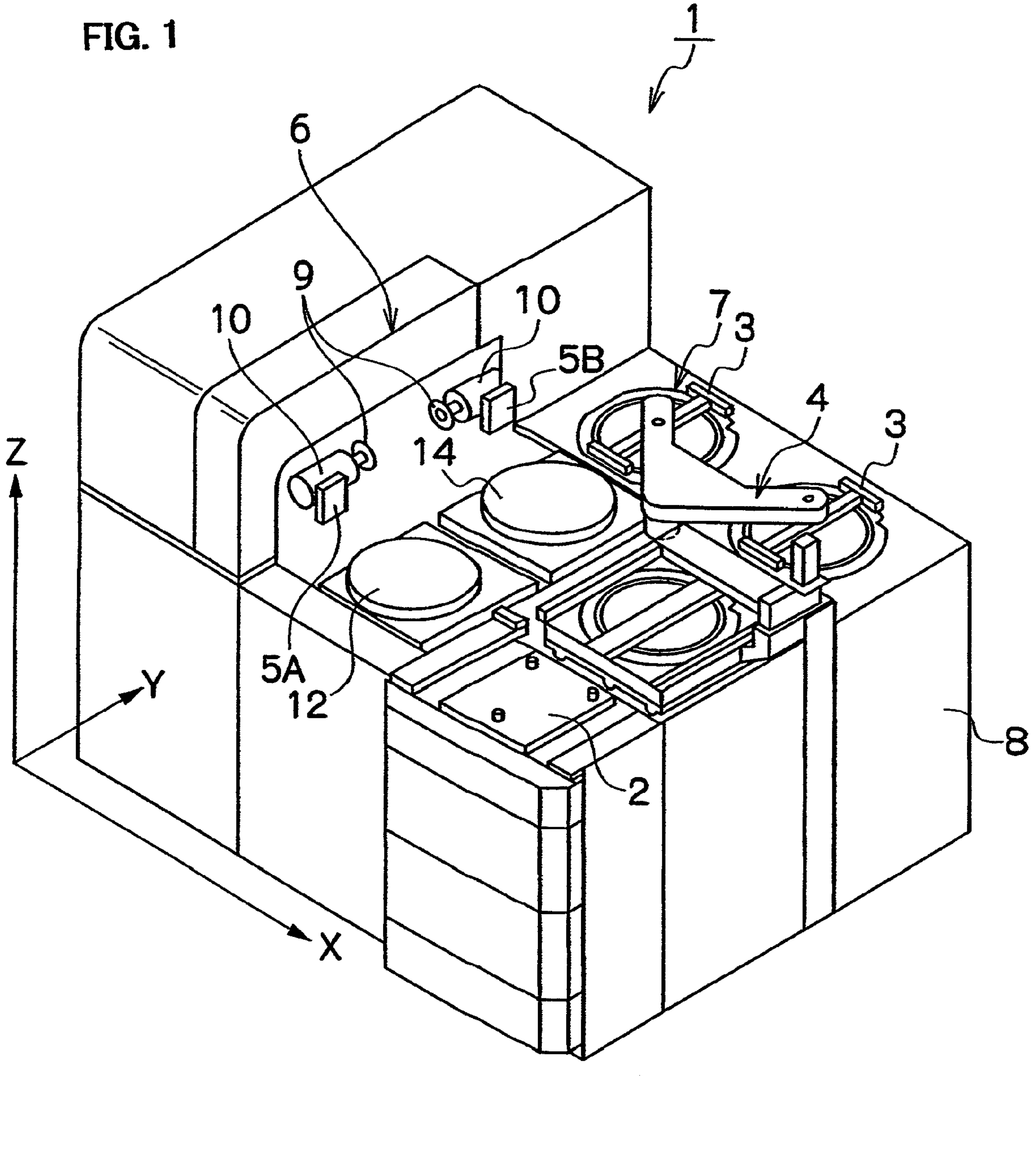
FIG. 1 is a perspective view illustrating an external appearance of a dicing apparatus for which a dicing method of the present invention is carried out.

First of all, the structure of a dicing apparatus for which the dicing method according to the present invention is described. FIG. 1 is an overall perspective view of the dicing apparatus.

A dicing apparatus 1 of the embodiment illustrated in FIG. 1 includes: a load port 2 where a cassette that houses a plurality of workpieces is transferred from an external device; a conveyance device 4 which includes an adsorption part 3 and conveys the workpiece to the respective parts of the apparatus; a first image pickup device 5A and a second image pickup device 5B, such as a microscope or a CCD camera, which observe an upper surface of the workpiece; a processing part 6; a spinner 7 which cleans and dries the processed workpiece; a controller 8 serving as a control device which controls the operations of the respective parts of the apparatus; and the like.

The processing part 6 includes two air-bearing or mechanical-bearing spindles 10, 10 of a high-frequency motor built-in type each of which has a blade 9 as a rotary blade and which are disposed so as to be opposed to each other. The spindles 10, 10 are rotated at high speed, and also are step-fed in a Y direction of the figure and fed while cutting-in in a Z direction of the figure independently of each other. The blade 9 is surrounded by a flange cover (not shown) which is opened on its front side and lower side, and a grinding fluid is supplied toward a processing point from a grinding nozzle provided to the flange cover. In addition, a cleaning nozzle (not shown) is provided to the flange cover, and a cleaning fluid is supplied toward the processing point from the cleaning nozzle.

The blade 9 is a thin disk-shaped grindstone, and an electrodeposition blade obtained by electrodepositing diamond abrasive grains or CBN abrasive grains with nickel, a metal-resin bonding blade obtained by bonding with a resin mixed with a metal power, or the like is used as the blade 9. The dimensions of the blade 9 are variously selected depending on the processing type. In a case where a general semiconductor wafer is diced as the workpiece, a blade having a diameter of approximately 50 mm and a thickness of approximately 30 μm is used.

Further, the processing part 6 includes two worktables of first worktable 12 and second worktable 14 having an identical shape, on which the workpiece is adsorbed and set, and the first worktable 12 and the second worktable 14 are fed while grinding (grinding feed) in an X direction of FIG. 1 by the movement of X tables 16, 18 serving as a moving device illustrated in FIG. 2 which is described below.

Figure 2:
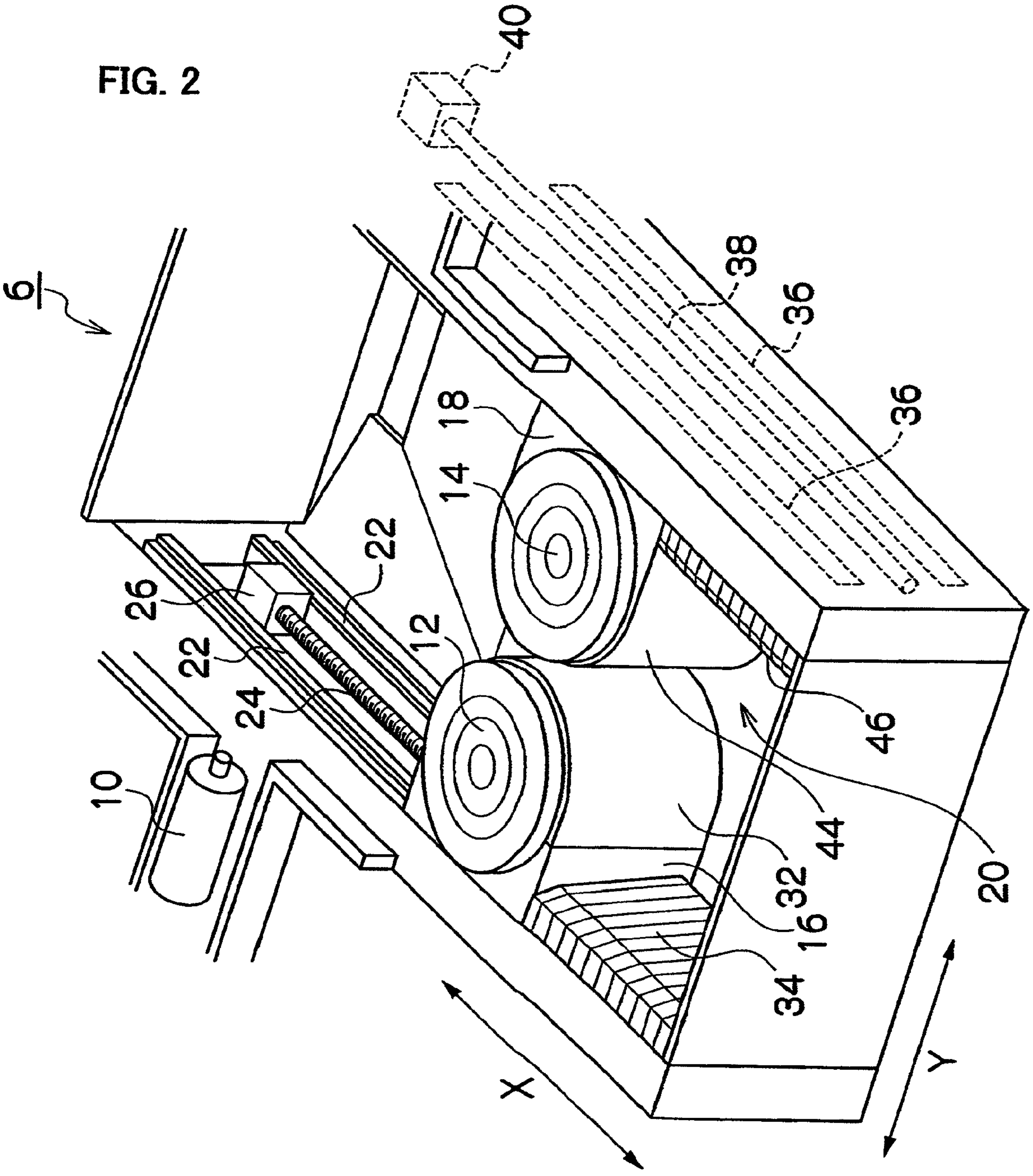
FIG. 2 is a perspective view illustrating a structure of a processing part of the dicing apparatus illustrated in FIG. 1.

FIG. 2 is a perspective view illustrating a main part of the processing part 6 of the dicing apparatus 1. As illustrated in FIG. 2, a box-shaped oil pan 20 is horizontally disposed below the first worktable 12 and the second worktable 14 of the processing part 6 so as to sufficiently surround the two first worktable 12 and second worktable 14. On a left side surface of the oil pan 20, two paired guide rails (guide mechanism) 22, 22 are arranged along the arrow X direction of the figure. Between the guide rails 22, 22, a ball screw 24 constituting a drive mechanism is arranged parallel to the guide rails 22, 22 and along the left side surface of the oil pan 20.

In addition, a servomotor 26 which rotates the ball screw 24 is disposed on a deeper side of the oil pan 20 in a depth direction thereof. Further, the X table 16 which is guided by the guide rails 22, 22 and is driven in the X direction by the rotation of the ball screw 24 by the servomotor 26 is disposed in a longitudinal direction. It should be noted that the drive mechanism of the present invention may be a drive mechanism using a linear motor in addition to the drive mechanism using the ball screw 24.

Figure 3:
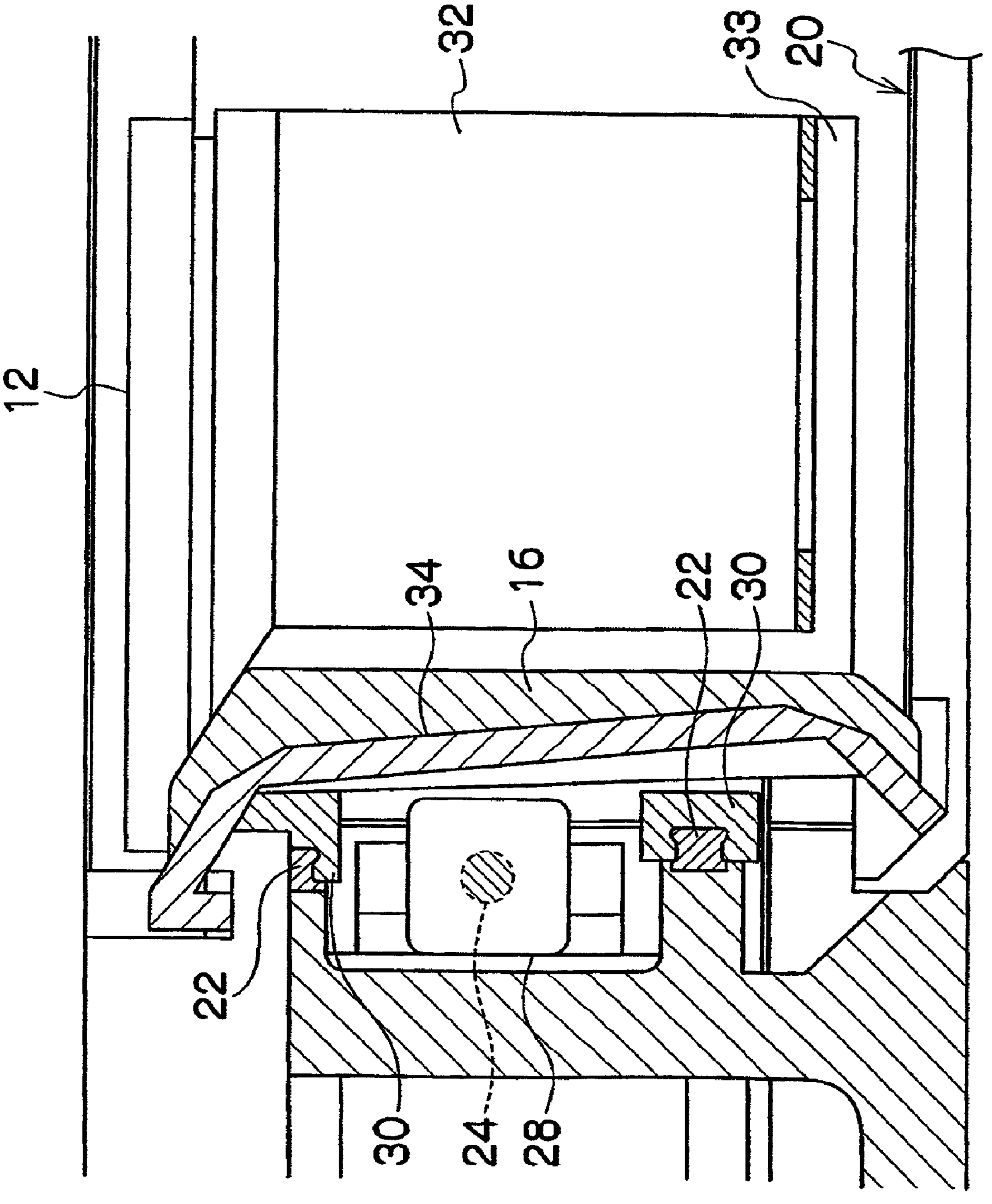
FIG. 3 is a cross sectional view illustrating a main part structure of the processing part illustrated in FIG. 2.

As illustrated in FIG. 3, the X table 16 includes a ball nut 28 which is screwed with the ball screw 24, and sliders 30, 30 which are slidably engaged with the guide rails 22, 22. Further, a θ table (θ-rotating shaft) 32 which θ-rotates about the Z direction (see FIG. 1) as an axis is mounted on the X table 16, and the first worktable 12 is attached to the θ table 32. The θ table 32 (rotating shaft) has a bottom surface which is fixed to an L-shaped fixture 33 attached to the X table 16 so that the first worktable 12 rotates on a horizontal plane in the θ direction.

In addition, a pair of accordion covers (accordion members) 34, 34, which expands and contracts by the movement of the X table 16 in the X direction and covers the guide rails 22, 22 and the ball screw 24, is disposed on the left side surface of the oil pan 20. One accordion cover 34 has one end which is fixed to a front side of the oil pan 20 in the depth direction thereof, and another end which is fixed to a front side edge of the X table 16 in the depth direction thereof. Another accordion cover 34 has one end which is fixed to a deeper side of the oil pan 20 in the depth direction thereof, and another end which is fixed to a deeper side edge of the X table 16 in the depth direction thereof. It should be noted that the another accordion cover 34 is omitted in FIG. 2.

On the other hand, as illustrated in FIG. 2, similarly on a right side surface of the oil pan 20, two paired guide rails (guide mechanism) 36, 36 are arranged along the arrow X direction of FIG. 1. Also between the guide rails 36, 36, a ball screw 38 constituting a drive mechanism is arranged parallel to the guide rails 36, 36 and along the right side surface of the oil pan 20.

In addition, a servomotor 40 which rotates the ball screw 38 is disposed on the deeper side of the oil pan 20 in the depth direction thereof. Further, the X table 18 which is guided by the guide rails 36, 36 and is driven in the X direction by the rotation of the ball screw 38 by the servomotor 40 is disposed.

The X table 18 is provided with a ball nut (not shown) which is screwed with the ball screw 38, and sliders (not shown) which are slidably engaged with the guide rails 36, 36. Further, a θ table (θ-rotating shaft) 44 which θ-rotates about the Z direction (see FIG. 1) as an axis is mounted on the X table 18, and the second worktable 14 is attached to the θ table 44. The θ table 44 (rotating shaft) has a bottom surface which is fixed to an L-shaped fixture (not shown) attached to the X table 18 so that the second worktable 14 rotates on a horizontal plane in the θ direction.

In addition, a pair of accordion covers (accordion members) 46, 46, which expands and contracts by the movement of the X table 18 in the X direction and covers the guide rails 36, 36 and the ball screw 38, is disposed on the right side surface of the oil pan 20. One accordion cover 46 has one end which is fixed to the front side of the oil pan 20 in the depth direction thereof, and another end which is fixed to a front side edge of the X table 18 in the depth direction thereof. Another accordion cover 46 has one end which is fixed to the deeper side of the oil pan 20 in the depth direction thereof, and another end which is fixed to a deeper side edge of the X table 18 in the depth direction thereof. It should be noted that the another accordion cover 46 is omitted in FIG. 2.

Figure 4:
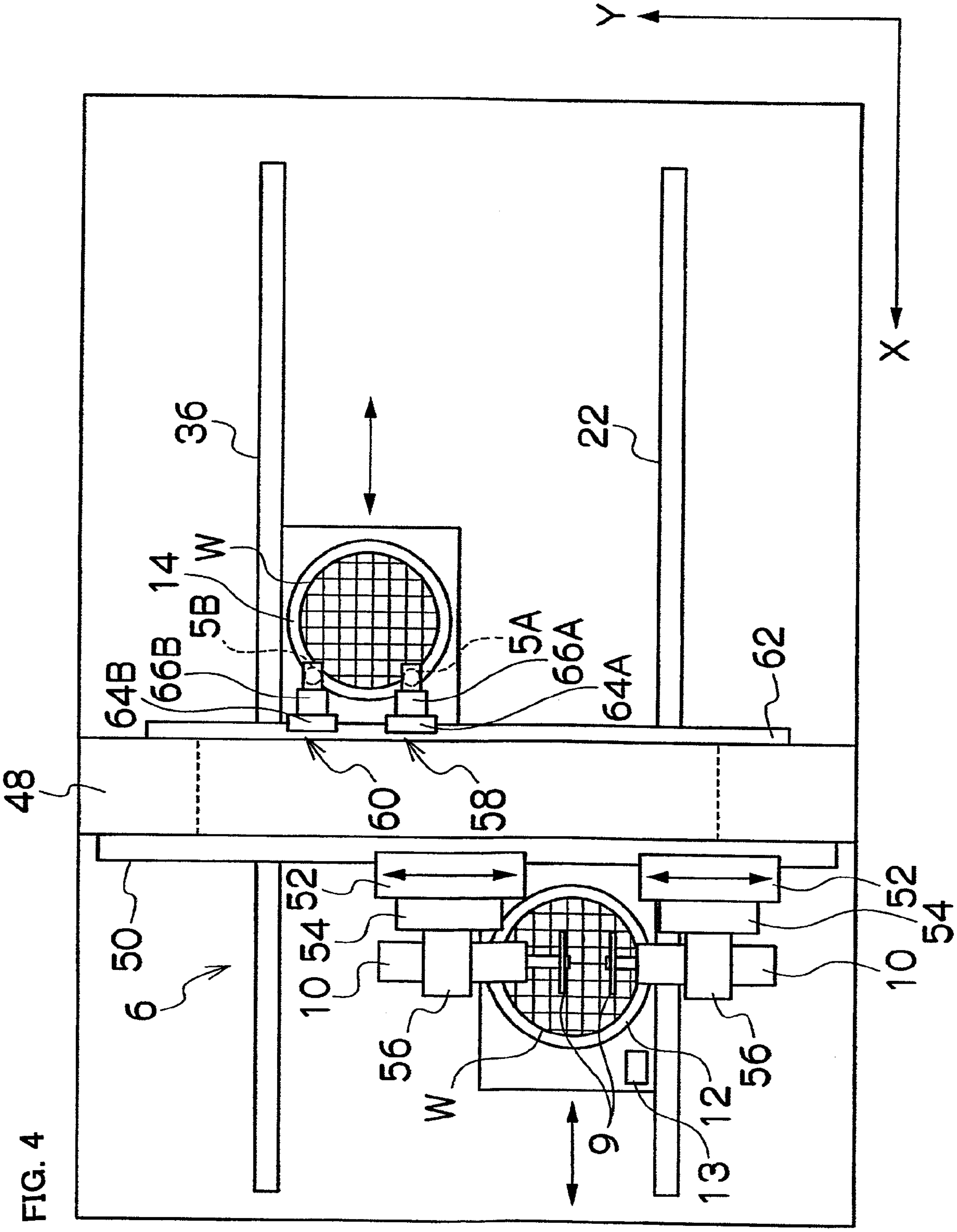
FIG. 4 is a plan view illustrating an alignment state of a workpiece on a second worktable.

In addition, as illustrated in FIG. 4, a gate-shaped guide base 48 is vertically disposed to the processing part 6. A spindle Y guide 50 is attached to a left side surface of the guide base 48 in FIG. 4, horizontally to the arrow Y direction of the figure. In addition, two spindle Y tables 52, 52 serving as a moving device, which are guided by the spindle Y guide 50 and are step-fed by a drive mechanism (not shown) in the Y direction, are disposed. Each of the spindle Y guide tables 52, 52 has a spindle Z table 54 which serves as a moving device and is fed while cutting-in by a guide rail (not shown) and a drive mechanism (not shown) in the arrow Z direction of the figure. The spindle 10 is attached to each spindle Z table 54 via a holder 56.

The two spindles 10, 10 are disposed so as to be opposed to each other and each have the rotary blade 9 attached to the tip thereof. With this mechanism, the two rotary blades 9, 9 are fed while cutting-in in the Z direction and step-fed in the Y direction independently of each other. In addition, a linear motor may be used as the drive mechanism for each of the spindle Y tables 52, 52 and the spindle Z tables 54. Alternatively, a servomotor and a lead screw may be used as the drive mechanism therefor.

Two image pickup device drive devices 58, 60 are provided on a right side surface of the guide base 48 in FIG. 4. The image pickup device drive devices 58, 60 include: an image pickup device Y guide 62 which is attached to the right side surface of the guide base 48 and is disposed horizontally to the arrow Y direction of the figure; image pickup device Y tables 64A, 64B which are guided by the image pickup device Y guide 62 and are moved by a drive mechanism (not shown) in the Y direction; and image pickup device Z tables 66A, 66B which are fed in the arrow Z direction of the figure by a guide rail (not shown) and a drive mechanism (not shown) provided in the image pickup device Y tables 64A, 64B.

The first image pickup device 5A and the second image pickup device 5B which observe the upper surface of a workpiece W are attached to the image pickup device Z table 66A and the image pickup device Z table 66B, respectively. It should be noted that the image pickup device drive devices 58, 60 are not necessarily attached to the guide base 48 but may be attached to the image pickup device Y guide as another guide base which is disposed parallel to the guide base 48.

The first image pickup device 5A and the second image pickup device 5B are fed in the Y direction and the Z direction of the figure by the image pickup device drive devices 58, 60 having the above-mentioned structure. It should be noted that known drive devices, such as the linear motor or the servomotor and the lead screw, may be similarly used as the drive mechanism for each of the image pickup device Y guide 62 and the image pickup device Z tables 66A, 66B. A CCD camera (not shown) is incorporated in each of the first image pickup device 5A and the second image pickup device 5B. An image of the workpiece W which is picked up by the CCD camera is subjected to a pattern matching process by an image processing apparatus provided in the controller 8 of FIG. 1, to thereby perform the alignment of the workpiece W. The control of the drive device for these respective parts, the control of the alignment operation, the control of the processing part 6, the control of the conveyance device 4, and the like are all performed by the controller 8.

Next, a description is given of the dicing method according to the present invention which is carried out for the dicing apparatus 1 having the above-mentioned structure.

In the dicing method of the present invention, first, the cassette which is set onto the load port 2 of the dicing apparatus 1 houses a plurality of dicing tapes, and the workpieces W which are attached to a frame via the dicing tapes are pulled out one by one from the cassette by the conveyance device 4, to be adsorbed by the first worktable 12.

Figure 5:
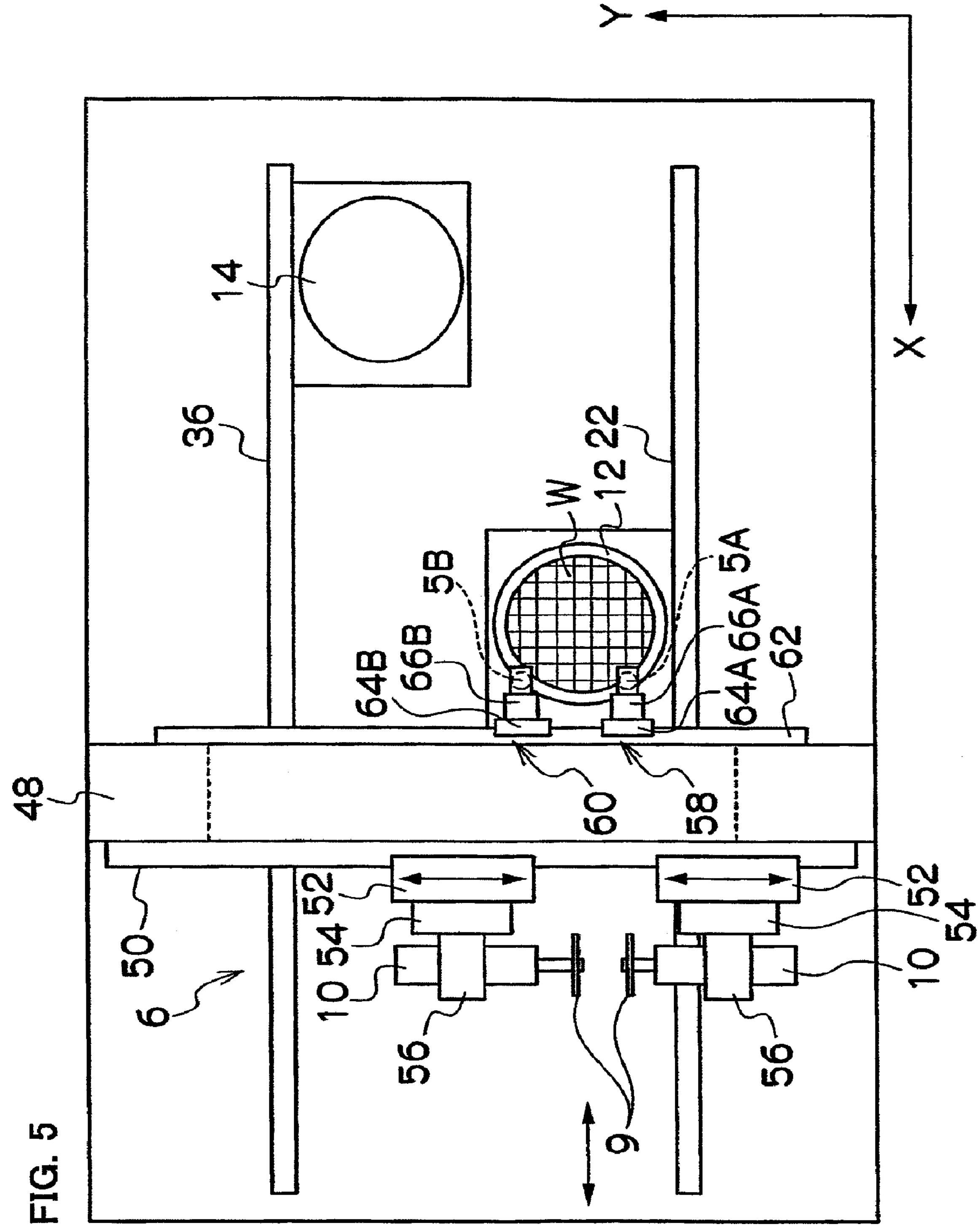
FIG. 5 is a plan view illustrating an alignment state of a workpiece on a first worktable.

After that, as illustrated in FIG. 5, the first worktable 12 is moved to below the image pickup device Y guide 62, and at the same time, the first image pickup device 5A and the second image pickup device 5B are conveyed by the image pickup device Y tables 64A, 64B to immediately above the workpiece. Here, the first image pickup device 5A and the second image pickup device 5B are brought into focus by the image pickup device Z tables 66A, 66B. Subsequently, an image of a pattern portion formed on the upper surface of the workpiece W is picked up by the CCD camera incorporated in each of the first image pickup device 5A and the second image pickup device 5B, and the alignment thereof is performed using a known pattern matching method. It should be noted that the next workpiece W is set onto the second worktable 14 during this alignment of workpiece.

The workpiece W after the alignment is conveyed to the processing part 6 by the first worktable 12 and is subjected to a dicing process. In this process, the two rotary blades 9, 9 are each fed while cutting-in to a necessary degree, and two lines of the processing region (street) are simultaneously processed by the grinding feed of the first worktable 12 in the X direction. Then, the rotary blades 9, 9 are step-fed by a necessary pitch in the Y direction to be positioned at the next street, and two lines of this street are similarly processed by the feeding for grinding of the first worktable 12 in the X direction. This operation is repeated, so that all the streets of the workpiece W in one direction are processed. After all the lines in one direction are processed, the workpiece W is rotated by 90 degrees by the rotation of the θ table 32, and streets which are orthogonal to the first-processed streets are processed.

When the first workpiece W is being subjected to the processes (processing, cleaning, and the like) subsequent to the alignment by the processing part 6, as illustrated in FIG. 4, the next workpiece W set onto the second worktable 14 is moved to below the image pickup device Y guide 62, and the first image pickup device 5A and the second image pickup device 5B are conveyed by the image pickup device Y tables 64A, 64B to immediately above this next workpiece W. Similarly here, the first image pickup device 5A and the second image pickup device 5B are brought into focus by the image pickup device Z tables 66A, 66B. An image of a pattern portion formed on the upper surface of the next workpiece W is picked up by the CCD camera incorporated in each of the first image pickup device 5A and the second image pickup device 5B, and the alignment thereof is performed.

At this time, in a case where the controller 8 detects that an image of the first workpiece W which is being processed on the first worktable 12 needs to be picked up again by the first image pickup device 5A and the second image pickup device 5B in order to perform, for the first workpiece W, a realignment, a kerf checking, or a checking of the diced chips, the controller 8 determines the priority between the alignment operation which is currently performed on the workpiece W on the second worktable 14 and the dicing operation which is performed on the workpiece W on the first worktable 12.

Normally, it takes a longer time to finish the dicing operation of the workpiece W excluding the alignment than the alignment operation. Further, if the workpiece during the processing is left for a long time, there arises a problem that the cutting fluid used for the processing is dried on the workpiece W. Therefore, the dicing operation has a higher priority than the alignment operation.

Figure 6:
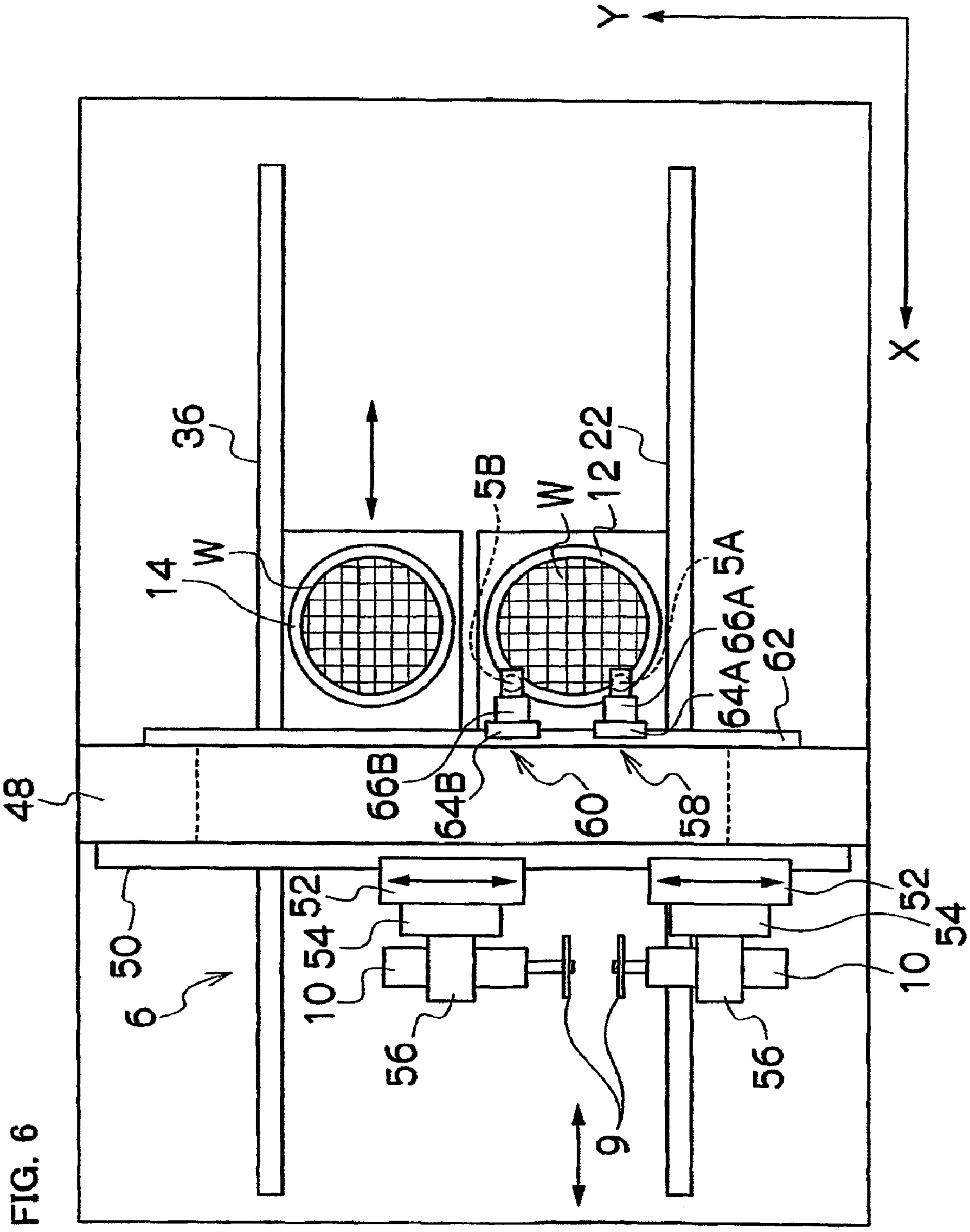
FIG. 6 is a plan view illustrating a state where an image of the workpiece on the first worktable is picked up again.

Accordingly, the controller 8 stores all pieces of data used for the alignment and state control information (position, automatic focus, and illuminated condition) on the position at the time of the interruption with regard to the workpiece W whose image is being picked up by the first image pickup device 5A and the second image pickup device 5B for the alignment operation, and temporarily interrupts the alignment operation. After the interruption, as illustrated in FIG. 6, the first image pickup device 5A and the second image pickup device 5B are moved to a position at which an image of the workpiece W on the first worktable 12 is picked up, and the workpiece W on the first worktable 14 whose processing is stopped is moved to below the first image pickup device 5A and the second image pickup device 5B.

Here again, the first image pickup device 5A and the second image pickup device 5B are brought into focus by the image pickup device Z tables 66A, 66B. An image of the upper surface of the workpiece W on the first worktable 12 whose processing is not finished is picked up by the CCD camera incorporated in each of the first image pickup device 5A and the second image pickup device 5B. Then, the realignment during the processing, the kerf checking, the checking of the cut chips, or the like is performed.

When the controller 8 recognizes that the image pickup of the workpiece W on the first worktable 12 is finished and thus the first image pickup device 5A and the second image pickup device 5B become available, as illustrated in FIG. 4, the first image pickup device 5A and the second image pickup device 5B are moved back to a position which is above the workpiece W set onto the second worktable 14 and is stored in the controller 8, and start the alignment operation again, and at the same time, the processing of the workpiece W on the first worktable 12 is restarted.

In this manner, the first image pickup device 5A and the second image pickup device 5B are preferentially used for the operation having a higher priority, and the interrupted operation is restarted at the interruption position. Accordingly, it becomes possible to increase the utilization rates of the first image pickup device 5A and the second image pickup device 5B and also to improve the utilization rate of the entire dicing apparatus 1.

Figure 7:
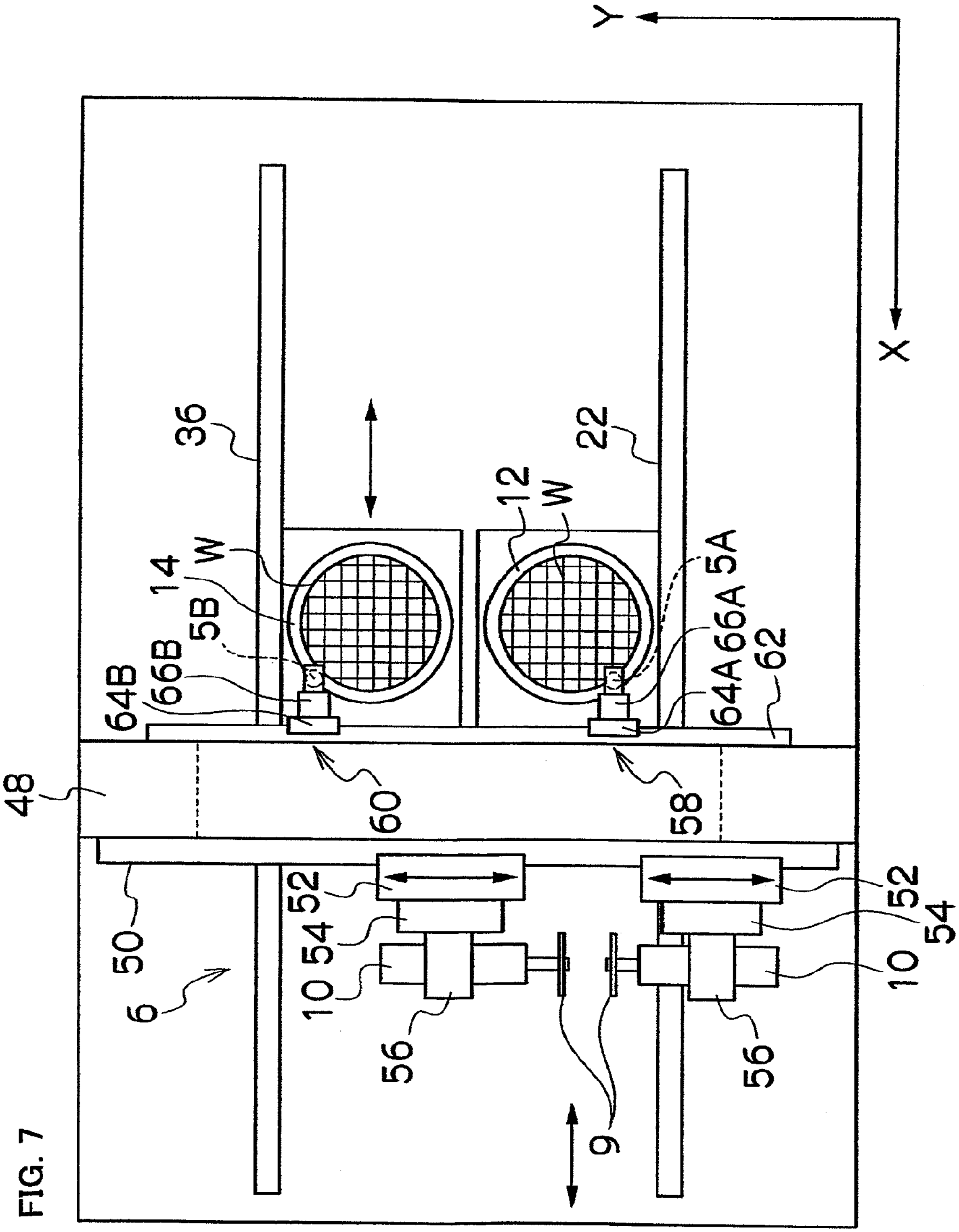
FIG. 7 is a plan view illustrating a state where an image of the workpiece on the first worktable is picked up by one image pickup device.
Figure 8:
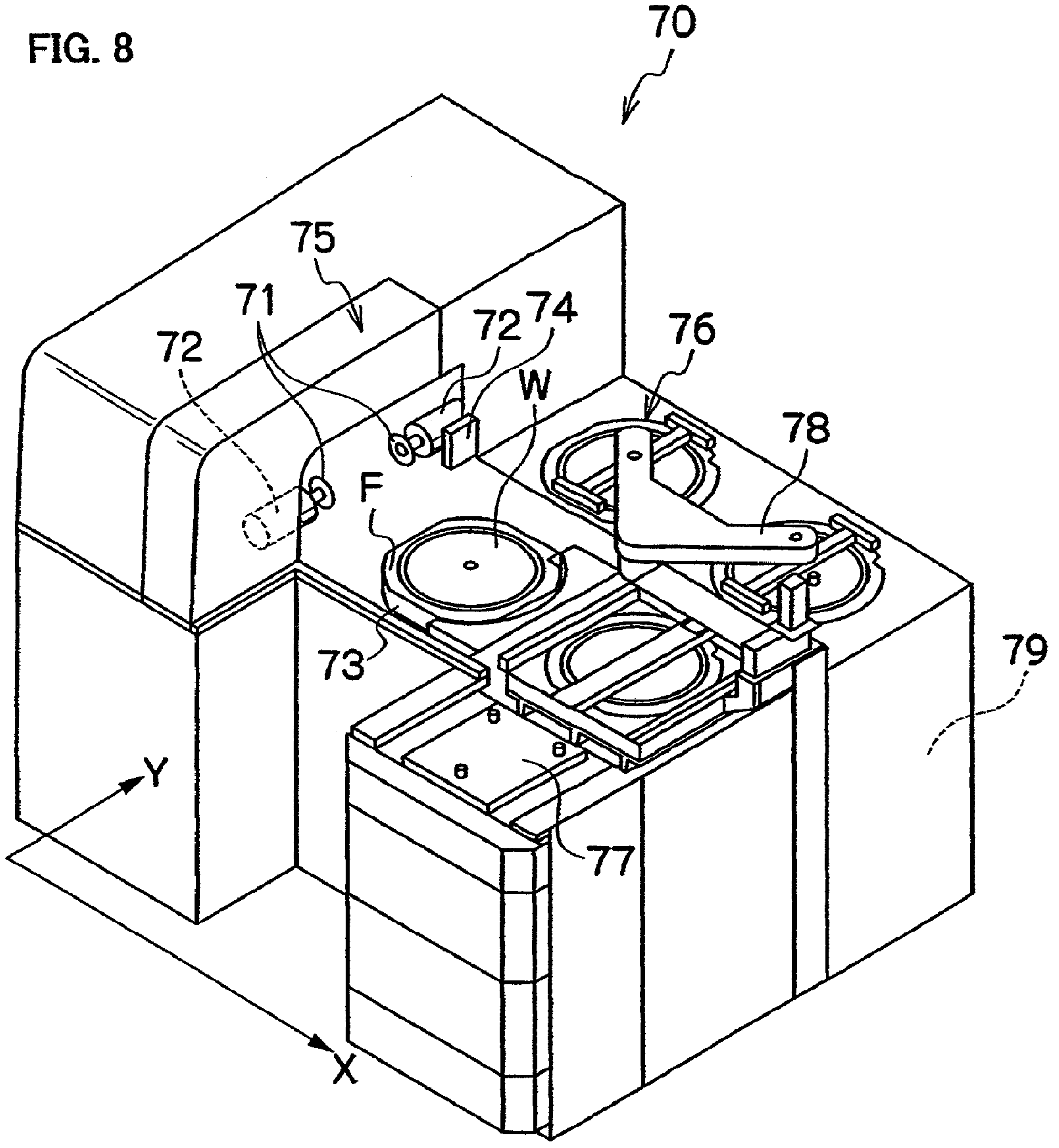
FIG. 8 is a perspective view illustrating an external appearance of a conventional dicing apparatus.
Figure 9:
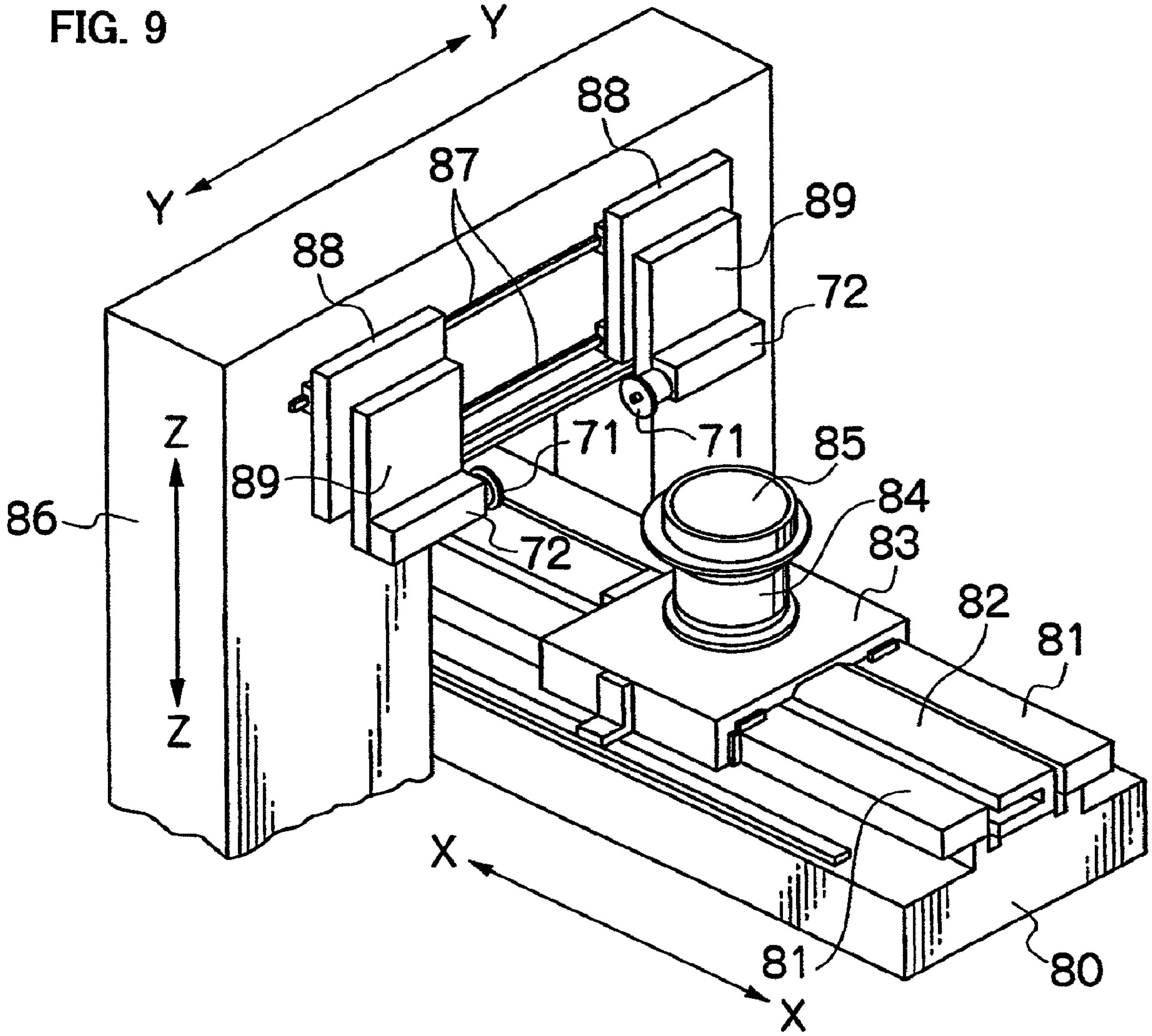
FIG. 9 is a perspective view illustrating a structure of a processing part of the dicing apparatus illustrated in FIG. 8.

It should be noted that, in this embodiment, both the first image pickup device 5A and the second image pickup device 5B are moved to above the workpiece W on the first worktable 12 whose image needs to be picked up again. Alternatively, as illustrated in FIG. 7, only the first image pickup device 5A may be moved to above the workpiece W on the first worktable 12 to pick up an image of the workpiece W on the first worktable 12, while the second image pickup device 5B may continue the current image pickup to continue the alignment operation.

In this manner, the first image pickup device 5A or the second image pickup device 5B is assigned to the operation having a higher priority to be used. Accordingly, it becomes possible to increase the utilization rates of the first image pickup device 5A and the second image pickup device 5B and also to improve the utilization rate of the entire dicing apparatus 1.

As described hereinabove, in the dicing method according to the present invention, the image pickup device is preferentially used for the operation having a higher priority, and the interrupted operation is restarted at the interruption position. Accordingly, it becomes possible to increase the utilization rate of the image pickup device and also to improve the utilization rate of the entire apparatus.

In this embodiment, the opposed spindles 10, 10 which have the blades 9 respectively attached to the opposed tips thereof are used as the cutting device. However, the present invention is not limited thereto, and can be preferably carried out for a dicing apparatus using a known cutting device such as a laser.

The invention claimed is:

1. A dicing method which is used for a dicing apparatus including a first worktable and a second worktable each of which can have a workpiece set thereon, a first image pickup device and a second image pickup device which pick up an image of the workpiece, and a first cutting device and a second cutting device which perform cutting of the workpiece, and the first cutting device and the second cutting device are moved for cutting by a moving device relative to the first worktable or the second worktable, the dicing method comprising:

in a case where a control device detects, during an image pickup of the workpiece set onto the second worktable by the first image pickup device and the second image pickup device, that an image of the workpiece set onto the first worktable also needs to be picked up by the first image pickup device and the second image pickup device, determining, by the control device, a priority between an operation performed on the first worktable and an operation performed on the second worktable; and when it is determined that the operation performed on the first worktable has a higher priority, interrupting the image pickup of the workpiece set onto the second worktable, and moving the first image pickup device and the second image pickup device to pickup an image of the workpiece on the first worktable.

2. The dicing method according to claim 1, comprising:

interrupting the image pickup of the workpiece set on the second worktable and storing all pieces of data used for alignment and state control information on an position at the time of the interruption;

moving the first image pickup device and the second image pickup device to perform the image pickup of the workpiece on the first worktable; and when the control device can recognize that the image pickup of the workpiece on the first worktable is finished and the first image pickup device and the second image pickup device become available, moving the first image pickup device and the second image pickup device so as to restart the image pickup of the workpiece at a position identical to the position at which the image pickup of the workpiece on the second worktable is interrupted.

3. A dicing method which is used for a dicing apparatus including a first worktable and a second worktable each of which can have a workpiece set thereon, a first image pickup device and a second image pickup device which pick up an image of the workpiece, and a first cutting device and a second cutting device which perform cutting of the workpiece, and the first cutting device and the second cutting device are moved for cutting by a moving device relative to the first worktable or the second worktable, the dicing method comprising:

in a case where a control device detects, during an image pickup of the workpiece set onto the second worktable by the first image pickup device and the second image pickup device, that an image of the workpiece set onto the first worktable also needs to be picked up by any one of the first image pickup device and the second image pickup device, determining, by the control device, a priority between an operation performed on the first worktable and an operation performed on the second worktable; and when it is determined that the operation performed on the first worktable has a higher priority, moving any one of the first image pickup device and the second image pickup device which are performing the image pickup of the workpiece set onto the second worktable, to a position at which an image of the workpiece on the first worktable is picked up, to pickup the image.

* * * * *